(12) United States Patent
Park et al.

(10) Patent No.: US 11,139,202 B2
(45) Date of Patent: Oct. 5, 2021

(54) FULLY ALIGNED TOP VIAS WITH REPLACEMENT METAL LINES

(71) Applicant: INTERNATIONAL BUSINESS MACHINES CORPORATION, Armonk, NY (US)

(72) Inventors: Chanro Park, Clifton Park, NY (US); Koichi Motoyama, Clifton Park, NY (US); Kenneth C. K. Cheng, Albany, NY (US); Chih-Chao Yang, Glenmont, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/585,412

(22) Filed: Sep. 27, 2019

(65) Prior Publication Data

US 2021/0098284 A1    Apr. 1, 2021

(51) Int. Cl.
*H01L 21/768* (2006.01)
*H01L 23/522* (2006.01)
*H01L 21/306* (2006.01)

(52) U.S. Cl.
CPC .. *H01L 21/76877* (2013.01); *H01L 21/30608* (2013.01); *H01L 21/76831* (2013.01); *H01L 21/76849* (2013.01); *H01L 21/76885* (2013.01); *H01L 21/76897* (2013.01); *H01L 23/5226* (2013.01)

(58) Field of Classification Search
CPC ......... H01L 21/76885; H01L 21/76816; H01L 21/76877; H01L 21/76897; H01L 23/5226; H01L 45/1675
See application file for complete search history.

(56) References Cited

U.S. PATENT DOCUMENTS

| | | | |
|---|---|---|---|
| 6,355,563 B1 | 3/2002 | Cha et al. | |
| 7,452,804 B2 | 11/2008 | Beck et al. | |
| 7,476,618 B2 | 1/2009 | Kilpelä et al. | |
| 8,021,897 B2* | 9/2011 | Sills | H01L 27/2463 438/3 |
| 9,236,292 B2 | 1/2016 | Romero et al. | |
| 9,252,188 B2* | 2/2016 | Tang | H01L 45/148 |
| 9,613,861 B2 | 4/2017 | Anderson et al. | |
| 9,852,986 B1 | 12/2017 | Stephens et al. | |
| 9,984,919 B1 | 5/2018 | Zhang et al. | |
| 2015/0056800 A1 | 2/2015 | Mebarki et al. | |
| 2015/0171010 A1 | 6/2015 | Bristol et al. | |
| 2016/0111329 A1* | 4/2016 | Zhang | H01L 21/32135 257/770 |
| 2018/0090366 A1 | 3/2018 | Deprat et al. | |

* cited by examiner

*Primary Examiner* — Zandra V Smith
*Assistant Examiner* — Abbigale A Boyle
(74) *Attorney, Agent, or Firm* — Tutunjian & Bitetto, P.C.; L. Jeffrey Kelly

(57) ABSTRACT

Integrated chips and methods of forming the same include forming upper dummy lines over lower conductive lines. The lower conductive lines are recessed to form conductive vias between the lower conductive lines and the upper dummy lines. The upper dummy lines are replaced with upper conductive lines that contact the conductive vias.

19 Claims, 10 Drawing Sheets

FULLY ALIGNED TOP VIAS WITH REPLACEMENT METAL LINES

BACKGROUND

The present invention generally relates to semiconductor device fabrication and, more particularly, to the fabrication of back end of line (BEOL) structures with increased device yield.

Copper BEOL lines can give higher line resistance than other metals at particularly small sizes. However, use alternative metals is challenging and subtractive patterning processes, for example that cut the line at a hardmask stage or after metal line patterning, can result in a high risk of tip-to-tip line shorting. Additionally, if low-k dielectric materials are used, patterning the metal line can cause damage to these materials.

SUMMARY

A method for fabricating an integrated chip includes forming upper dummy lines over lower conductive lines. The lower conductive lines are recessed to form conductive vias between the lower conductive lines and the upper dummy lines. The upper dummy lines are replaced with upper conductive lines that contact the conductive vias.

A method for fabricating an integrated chip includes forming lower conductive lines on an underlying layer. A dielectric stack is formed around the lower conductive lines, including a lower interlayer dielectric layer and a sacrificial dielectric layer on top of the lower interlayer dielectric layer. Upper dummy lines are formed over lower conductive lines. The lower conductive lines are recessed below a bottom surface of the sacrificial dielectric layer to form conductive vias between the lower conductive lines and the upper dummy lines. The sacrificial dielectric layer is etched away. An upper interlayer dielectric layer is formed around the upper dummy lines. The upper dummy lines are replaced with upper conductive lines that contact the conductive vias.

An integrated chip includes a set of lower conductive lines. A set of upper conductive lines is positioned over the lower conductive lines. At least one via, positioned between a first conductive line of the set of lower conductive lines and a second conductive line of the set of upper conductive lines, is fully aligned with the first conductive line and the second conductive line.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention use a dummy material in place of the conductive metal during fabrication. The fabrication of the final metal lines is then performed patterning the dummy material and then replacing the dummy material with a conductive material. This has an additional benefit in forming the metal lines after a surrounding dielectric has been formed, making it possible to use a low-k dielectric material without risk of damage from a metal-patterning process. Additionally, the resulting structures have a low risk of tip-to-tip shorting.

Figure 1:
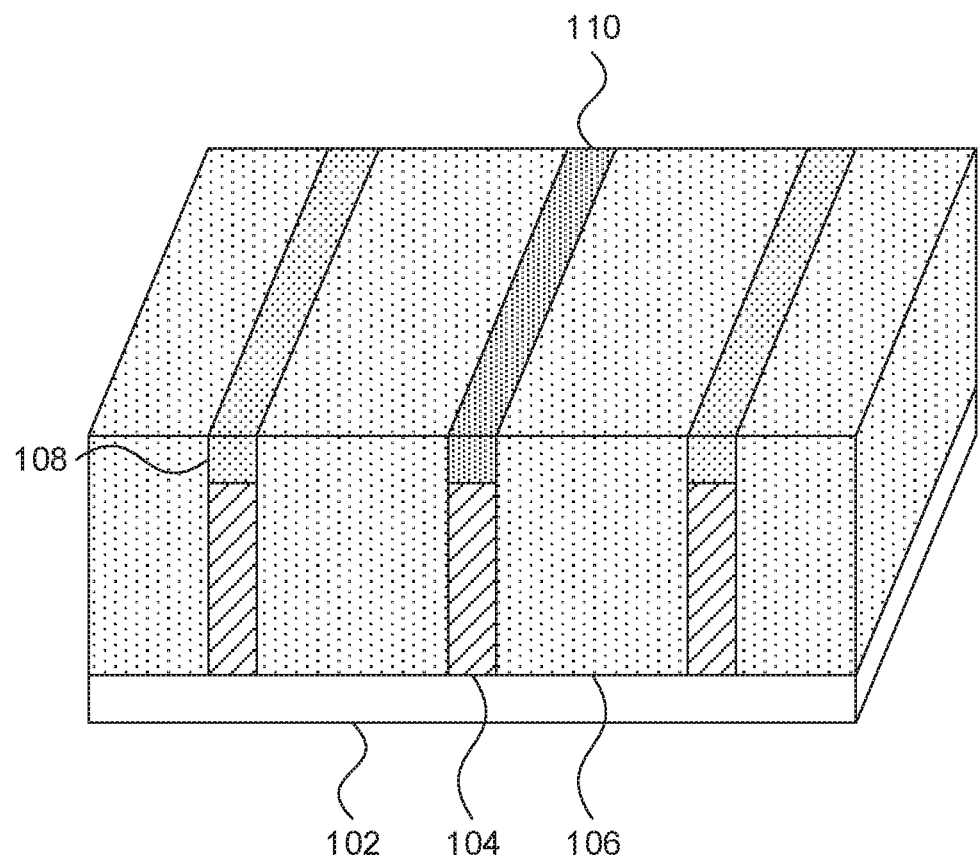
FIG. 1 shows a three-dimensional, isometric cut-away view of a step in the fabrication of an integrated chip where a lower interlayer dielectric layer is formed around lower conductive lines in accordance with an embodiment of the present invention.

Referring now to the drawings in which like numerals represent the same or similar elements and initially to FIG. 1, a three-dimensional view of a step in the fabrication of a semiconductor device is shown. A set of bottom conductive lines 104 are shown on an underlying layer 102. The underlying layer 102 can be formed from any appropriate material, such as semiconductor material or an interlayer dielectric, and can include active or passive devices within it, such as transistors, capacitors, transmission lines, and any other appropriate structure. The device(s) in the underlying layer 102 can make electrical contact with the conductive lines 104.

It should be understood that the conductive lines 104 can be formed from any appropriate conductive material. Although it is specifically contemplated that the conductive lines 104 can be formed from a metal, such as ruthenium, cobalt, or molybdenum, or alloys thereof, may be used, other conducive materials can be used instead, such as other metals, including tungsten, titanium, tantalum, zirconium, copper, aluminum, lead, platinum, tin, silver, gold, or a non-metal conductive material, such as polycrystalline or amorphous silicon, germanium, silicon germanium, carbon nanotubes, conductive carbon, graphene, or any suitable combination of these materials. The conductive material may further include dopants that are incorporated during or after deposition.

The conductive lines 104 are surrounded by an interlayer dielectric 106. It is specifically contemplated that the interlayer dielectric can be formed from a low-k dielectric material. As used herein, a low-k dielectric material refers to materials having a dielectric constant that is lower than the dielectric constant of silicon dioxide. Exemplary low-k dielectric materials include, e.g., silicocarbon oxyhydride, certain aromatic hydrocarbon polymer compositions, carbon-doped silicon oxide, fluorine-doped silicon oxide, tetraethyl orthosilicate, hydrogen silsesquioxane, methylsilsesquioxane, and undoped silica glass.

The conductive lines 104 are capped by alternating hardmask materials, including first hardmasks 108 and second hardmasks 110. These hardmasks 108/110 are formed from materials which are selectively etchable with respect to one another. As used herein, the term "selective" in reference to a material removal process denotes that the rate of material removal for a first material is greater than the rate of removal for at least another material of the structure to which the material removal process is being applied. Thus, in the event that a mask is misplaced and unintentionally exposes a neighboring line, the selective etch process will not damage the neighboring line. The hardmasks 108/110 have a height that corresponds to the height of the vertical vias that will be formed.

Figure 2:
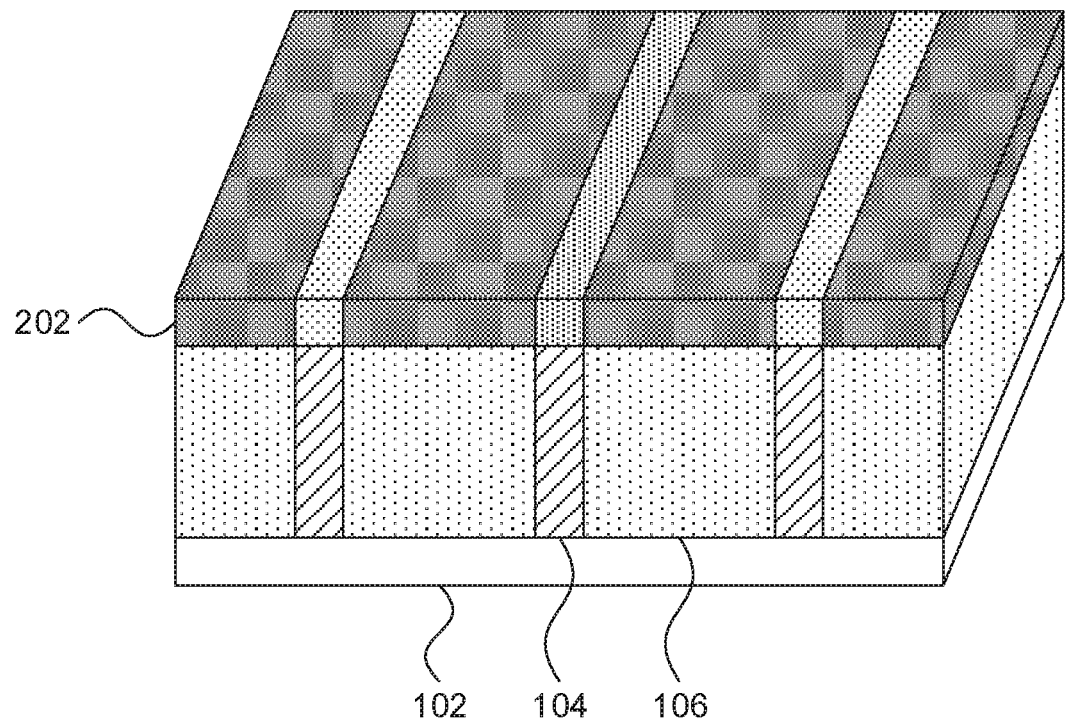
FIG. 2 shows a three-dimensional, isometric cut-away view of a step in the fabrication of an integrated chip where the lower interlayer dielectric is recessed and a sacrificial layer is formed in accordance with an embodiment of the present invention.

Referring now to FIG. 2, a three-dimensional view of a step in the fabrication of a semiconductor device is shown. The interlayer dielectric 106 is recessed and a sacrificial dielectric layer 202 is deposited. It should be noted that this step is optional, but helps minimize damage to the interlayer dielectric 106. The interlayer dielectric 106 can be recessed to a depth that is, for example, about 5 nm to about 10 nm greater than the height of the hardmasks 108/110. Any appropriate material can be used for the sacrificial dielectric layer 202 as long as it has appropriate etch selectivity to the hardmasks 108/110 and the interlayer dielectric 106. Exemplary materials for the sacrificial dielectric layer 202 include silicon dioxide, silicon nitride, silicon carbonitride, silicoboron carbonitride, and silicon oxycarbonitride.

Any appropriate isotropic or anisotropic etch can be used to recess the interlayer dielectric 106. Any appropriate deposition process can be used to form the sacrificial dielectric layer 202, including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. to about 450° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
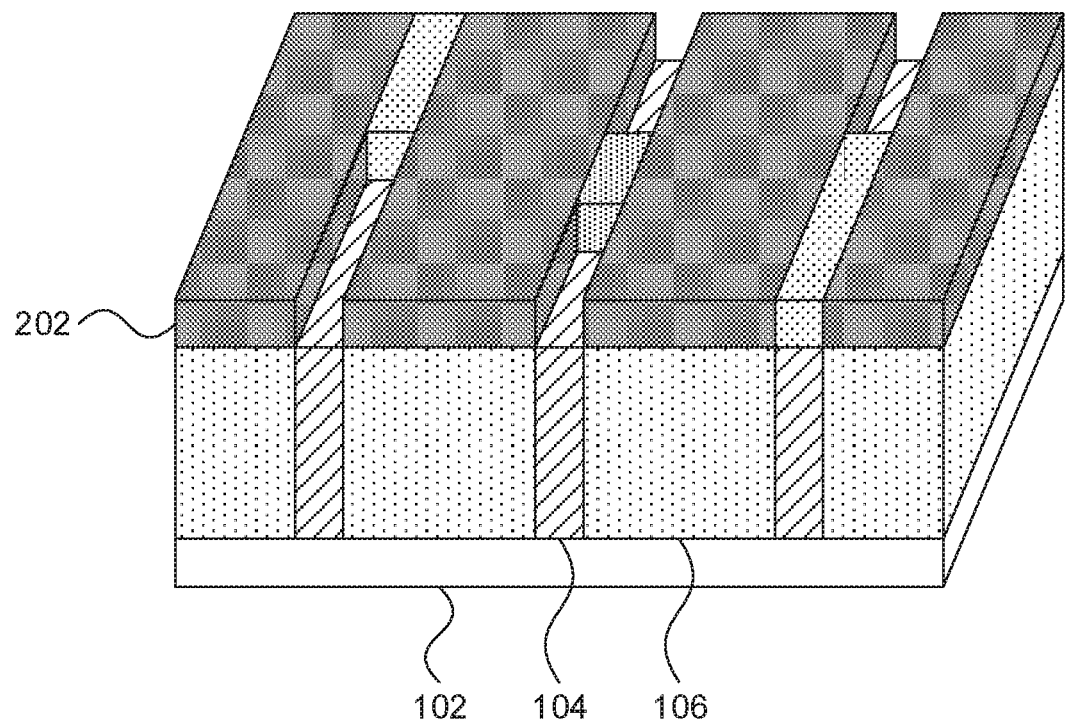
FIG. 3 shows a three-dimensional, isometric cut-away view of a step in the fabrication of an integrated chip where hardmasks for the lower conductive lines are patterned for via placement in accordance with an embodiment of the present invention.

Referring now to FIG. 3, a three-dimensional view of a step in the fabrication of a semiconductor device is shown. The hardmasks 108 and 110 are patterned in accordance with via positioning using selective etches. In particular, masks are formed and portions of the hardmasks 108/110 are selectively removed. Hardmask material is left in positions where no via should be formed. The lengths of the vias along the conductive lines 104 may be exaggerated to make it possible to form fully aligned vias. In other words, forming vias at this stage to the intended dimensions of the final vias will often result in mispositioning errors, as it can be difficult to place a structure in the exact position it is intended, which can increase via resistance. By making the vias larger than needed in FIG. 3, full overlap can be ensured. Excess material can be removed later in the process.

Figure 4:
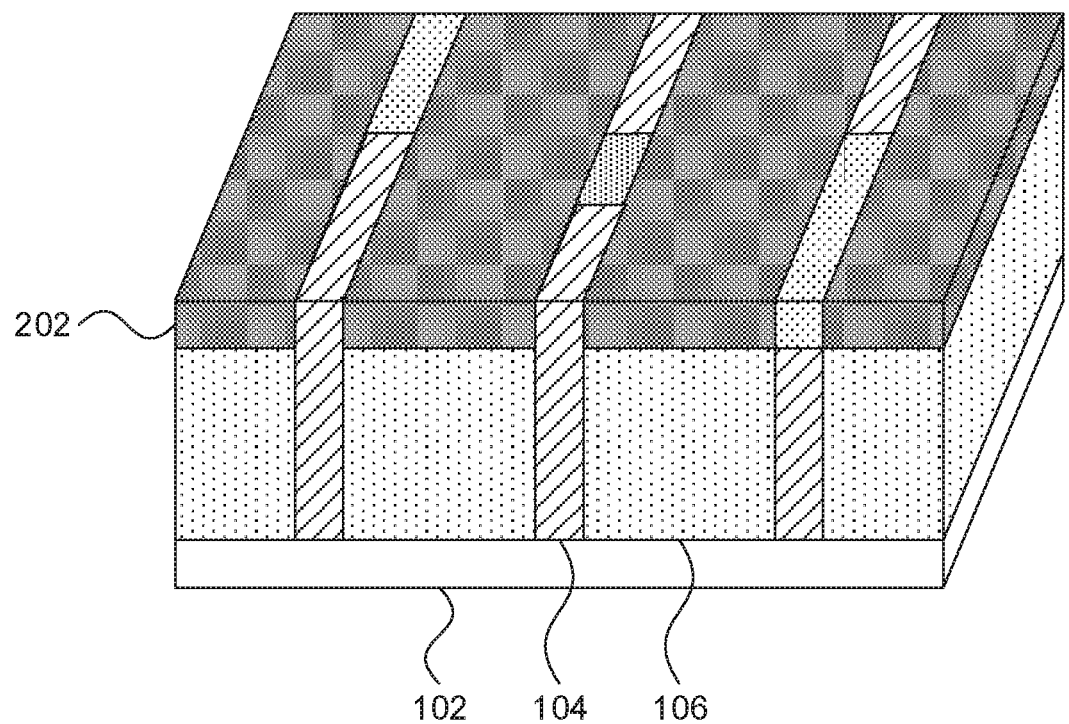
FIG. 4 shows a three-dimensional, isometric cut-away view of a step in the fabrication of an integrated chip where additional conductive material is deposited to extend the lower conductive lines in via regions in accordance with an embodiment of the present invention.

Referring now to FIG. 4, a three-dimensional view of a step in the fabrication of a semiconductor device is shown. Additional conductive material is deposited by any appropriate process to extend the conductive lines 104 up to the height of the sacrificial dielectric layer 202. Excess material can then be removed from the top surfaces using a chemical mechanical planarization (CMP) process. CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

Figure 5:
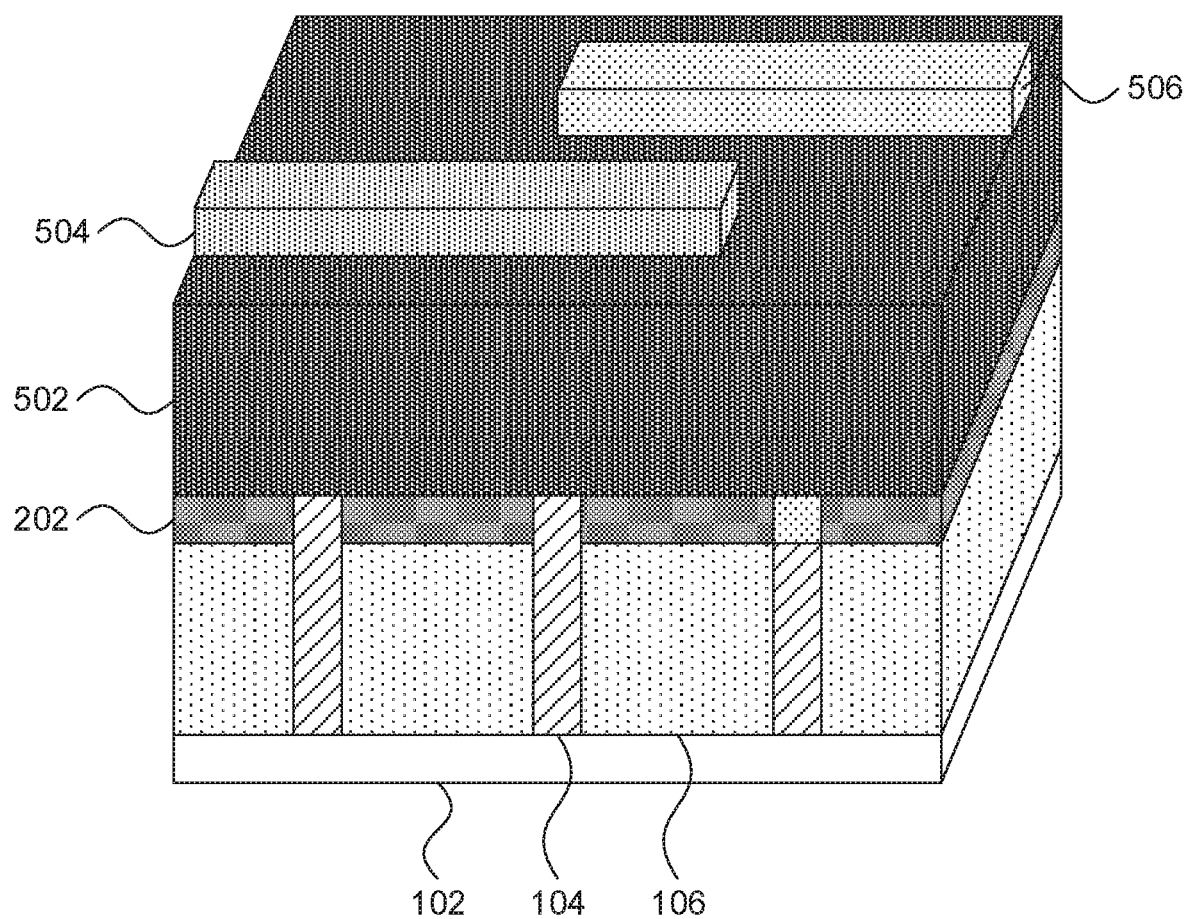
FIG. 5 shows a three-dimensional, isometric cut-away view of a step in the fabrication of an integrated chip where a dummy dielectric layer is formed over the sacrificial layer and the lower conductive lines in accordance with an embodiment of the present invention.

Referring now to FIG. 5, a three-dimensional view of a step in the fabrication of a semiconductor device is shown. A dummy layer 502 is deposited over the top surface by any appropriate deposition process. The dummy layer 502 can be formed from any material that is easy to pattern and remove and that has appropriate etch selectivity with respect to the underlying layers. For example, the dummy layer 502 can be formed from titanium nitride or amorphous silicon.

Hardmask layers 504 and 506 can then be formed and patterned on top of the dummy layer 502. The hardmask layers 504/506 are set to mask the positions metal lines for an upper layer of the device and can be formed from the same materials as hardmasks 108/110 or from any other appropriate material.

Figure 6:
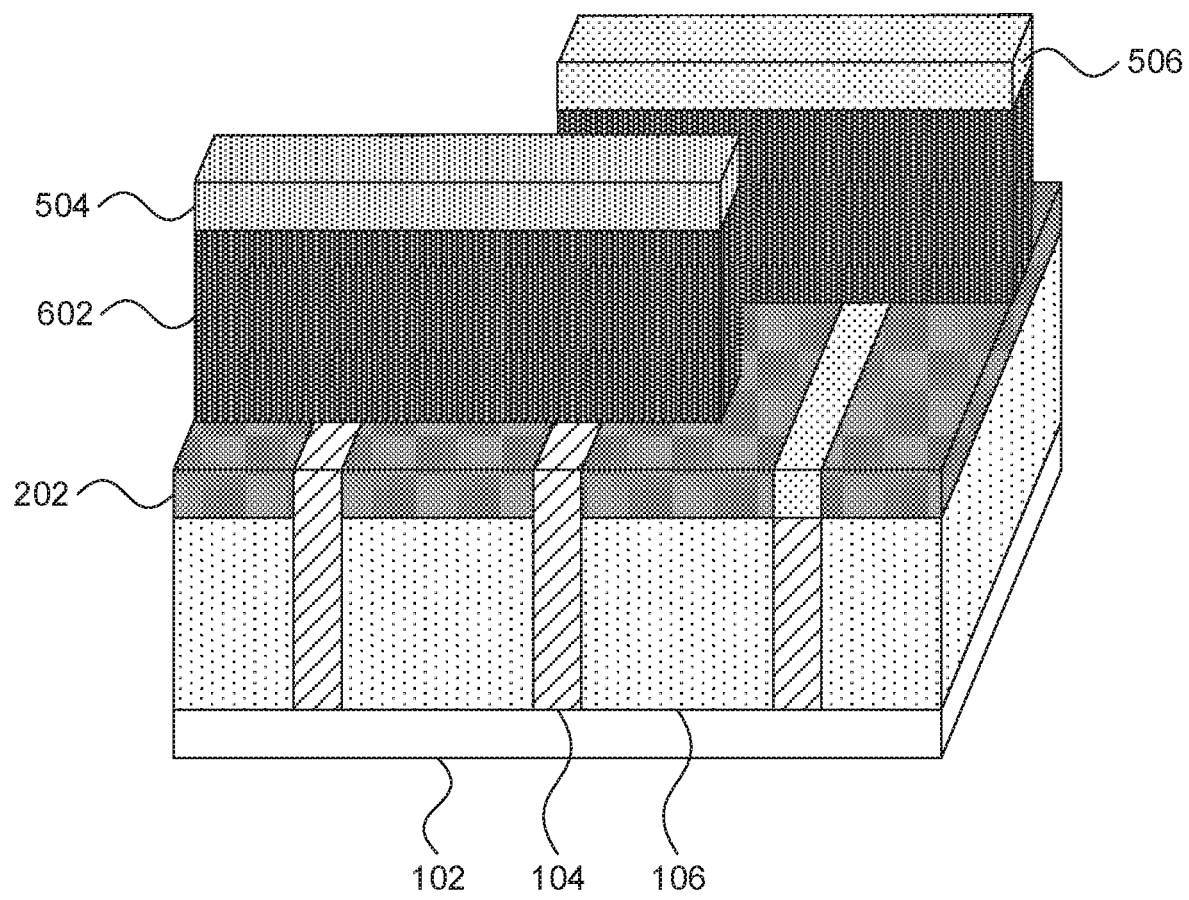
FIG. 6 shows a three-dimensional, isometric cut-away view of a step in the fabrication of an integrated chip where the dummy dielectric layer is patterned to form dummy lines in accordance with an embodiment of the present invention.

Referring now to FIG. 6, a three-dimensional view of a step in the fabrication of a semiconductor device is shown. The dummy layer 502 is etched down around the hardmasks 504/506 to form dummy lines 602. Any appropriate anisotropic etch can be used, such as reactive ion etching (RIE). RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 7:
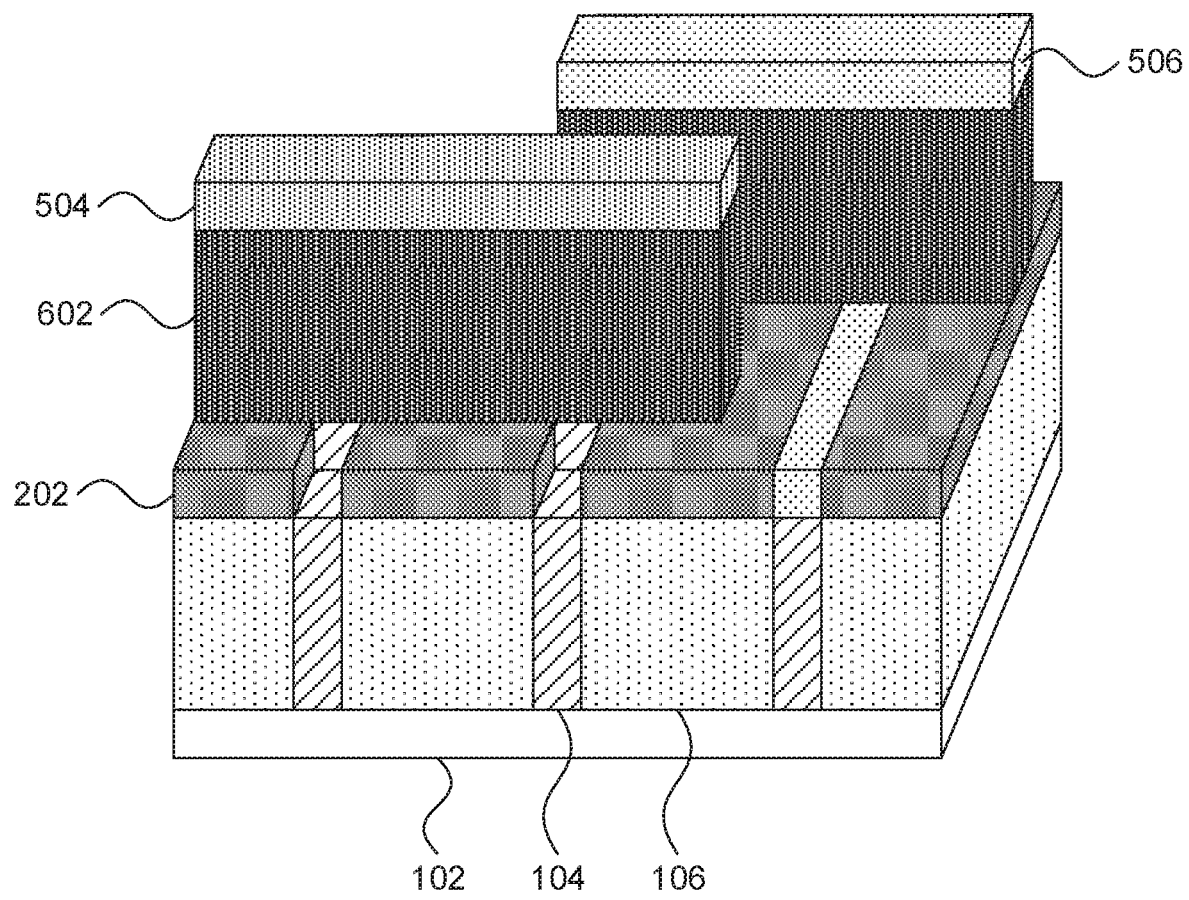
FIG. 7 shows a three-dimensional, isometric cut-away view of a step in the fabrication of an integrated chip where the lower conductive lines are recessed in exposed areas around the dummy lines in accordance with an embodiment of the present invention.

Referring now to FIG. 7, a three-dimensional view of a step in the fabrication of a semiconductor device is shown. The exposed portions of conductive lines 104 are selectively recessed using an anisotropic etch. The depth of the recess corresponds to the via height. Erosion of the sacrificial dielectric layer 202 is not an issue, as this layer is removed in a subsequent processing step.

Figure 8:
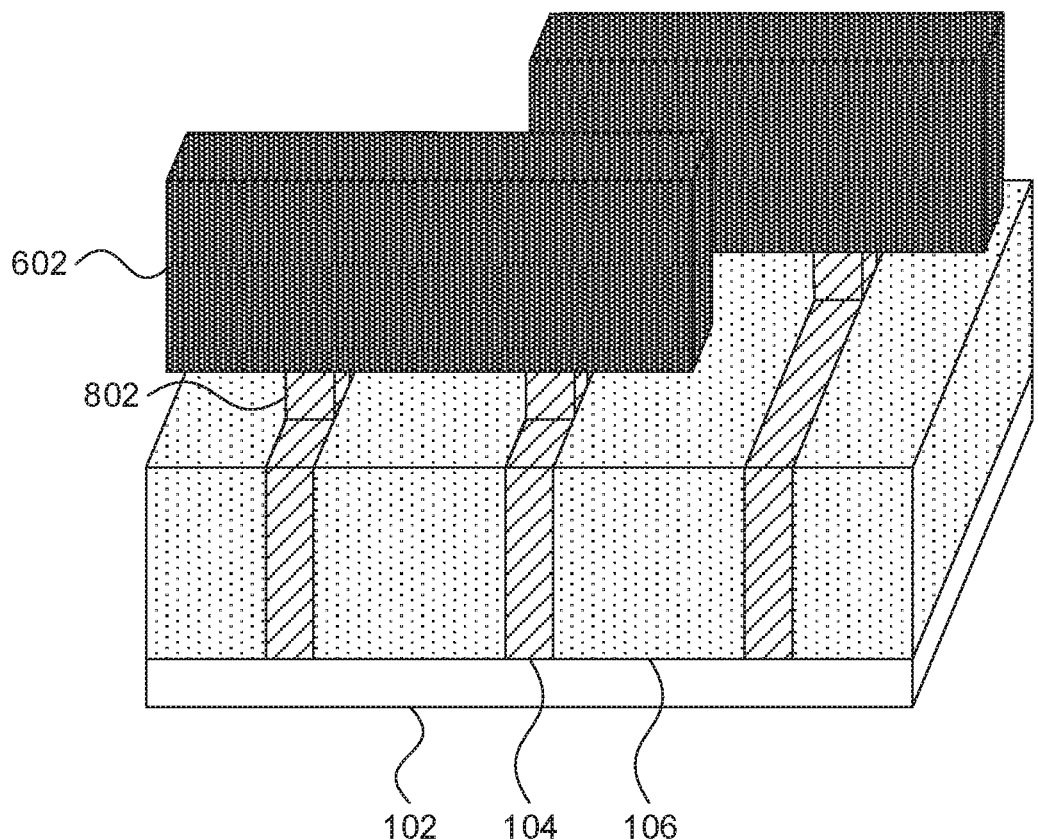
FIG. 8 shows a three-dimensional, isometric cut-away view of a step in the fabrication of an integrated chip where the sacrificial layer is etched away to expose vias in accordance with an embodiment of the present invention.

Referring now to FIG. 8, a three-dimensional view of a step in the fabrication of a semiconductor device is shown. The hardmasks 108/110/504/506 are etched away and the sacrificial dielectric layer 202 is removed, exposing vias 802.

Figure 9:
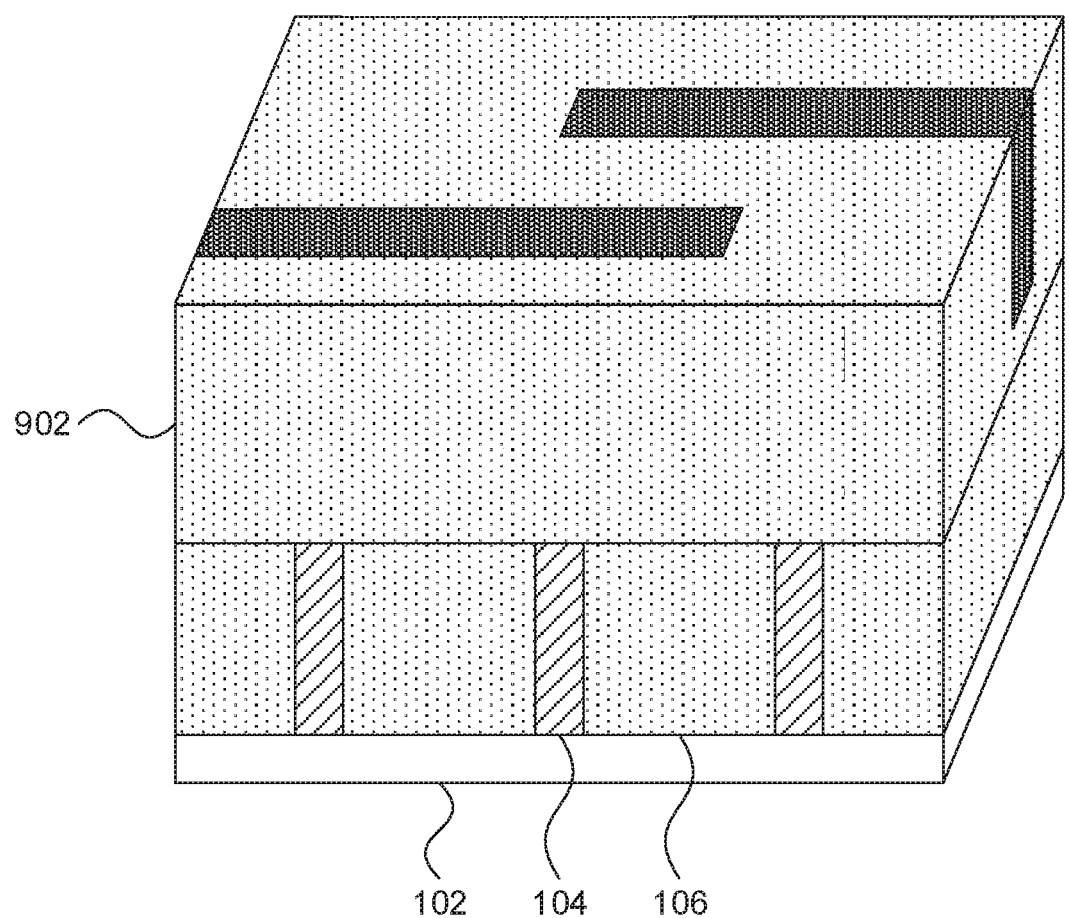
FIG. 9 shows a three-dimensional, isometric cut-away view of a step in the fabrication of an integrated chip where an upper interlayer dielectric layer is formed around the dummy lines and the vias in accordance with an embodiment of the present invention.

Referring now to FIG. 9, a three-dimensional view of a step in the fabrication of a semiconductor device is shown. An upper interlayer dielectric 902 is deposited using a conformal deposition process that fills dielectric material around and under the dummy lines 602 and the vias 802. It is specifically contemplated that the upper interlayer dielectric 902 can be formed from the same material as the lower interlayer dielectric 106, such as a low-k dielectric material, or can be formed from any other appropriate dielectric material.

Figure 10:
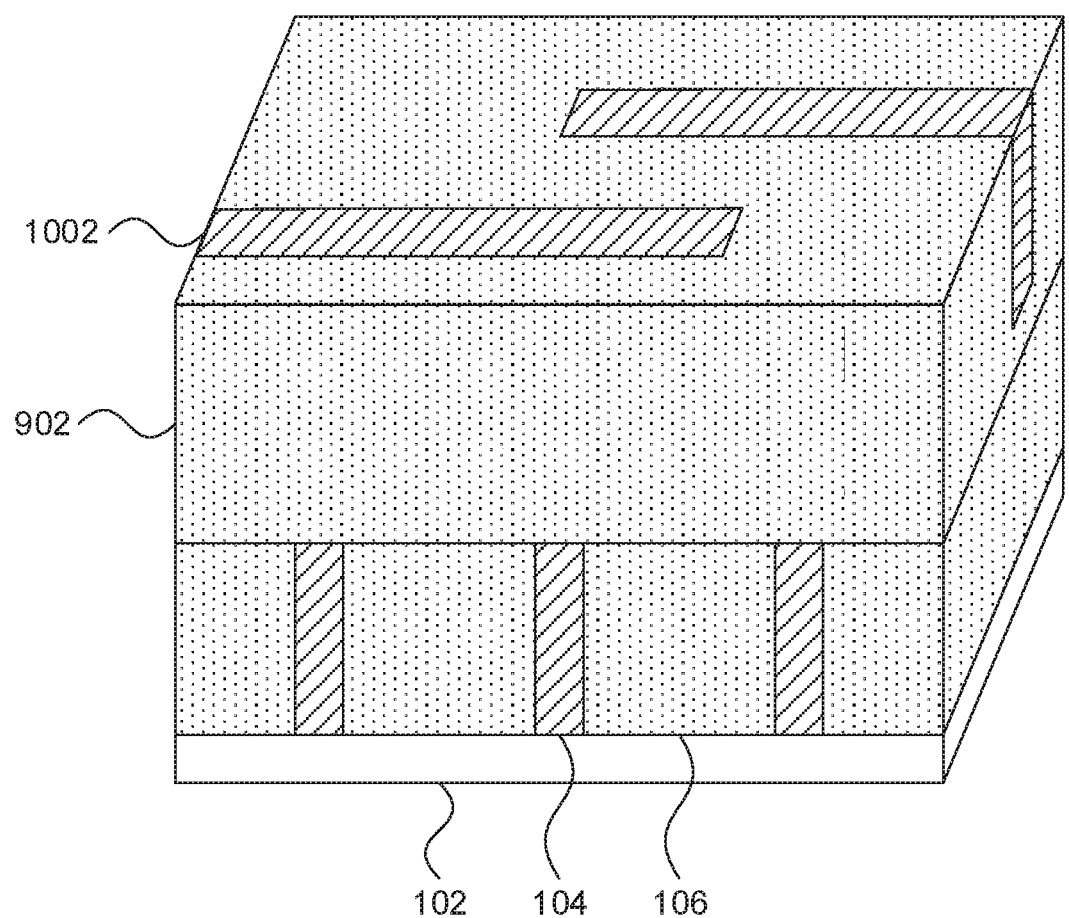
FIG. 10 shows a three-dimensional, isometric cut-away view of a step in the fabrication of an integrated chip where the dummy lines are replaced by upper conductive lines in accordance with an embodiment of the present invention.

Referring now to FIG. 10, a three-dimensional view of a step in the fabrication of a semiconductor device is shown. The dummy lines 602 are etched away using any appropriate isotropic or anisotropic etch that selectively removes the dummy material without damaging the interlayer dielectric 902 or the underlying vias 802. Conductive material is then deposited to replace the dummy lines 602 to form upper conductive lines 1002. It is specifically contemplated that the upper conductive lines 1002 can be formed from the same material as the lower conductive lines 104, but it should be understood that any appropriate conductive material can be used instead.

In this manner, fully aligned vias 802 can be formed without an offset to provide low via resistance using any appropriate conductive material. Furthermore, there is no damage to the interlayer dielectric material, providing superior capacitive properties as the low-k material provides a more complete barrier to capacitive effects.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used therein, the singular forms "a" "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below"or "beneath" other el nts or features would then be oriented "above" the other elements or features. Thus, the term "below" can encompass both an orientation of above and below. The device can be otherwise oriented (rotated 90 degrees or at other orientations), and the spatially relative descriptors used he can be interpreted accordingly. In addition, it will also be understood that when a layer is referred to as being between layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 11:
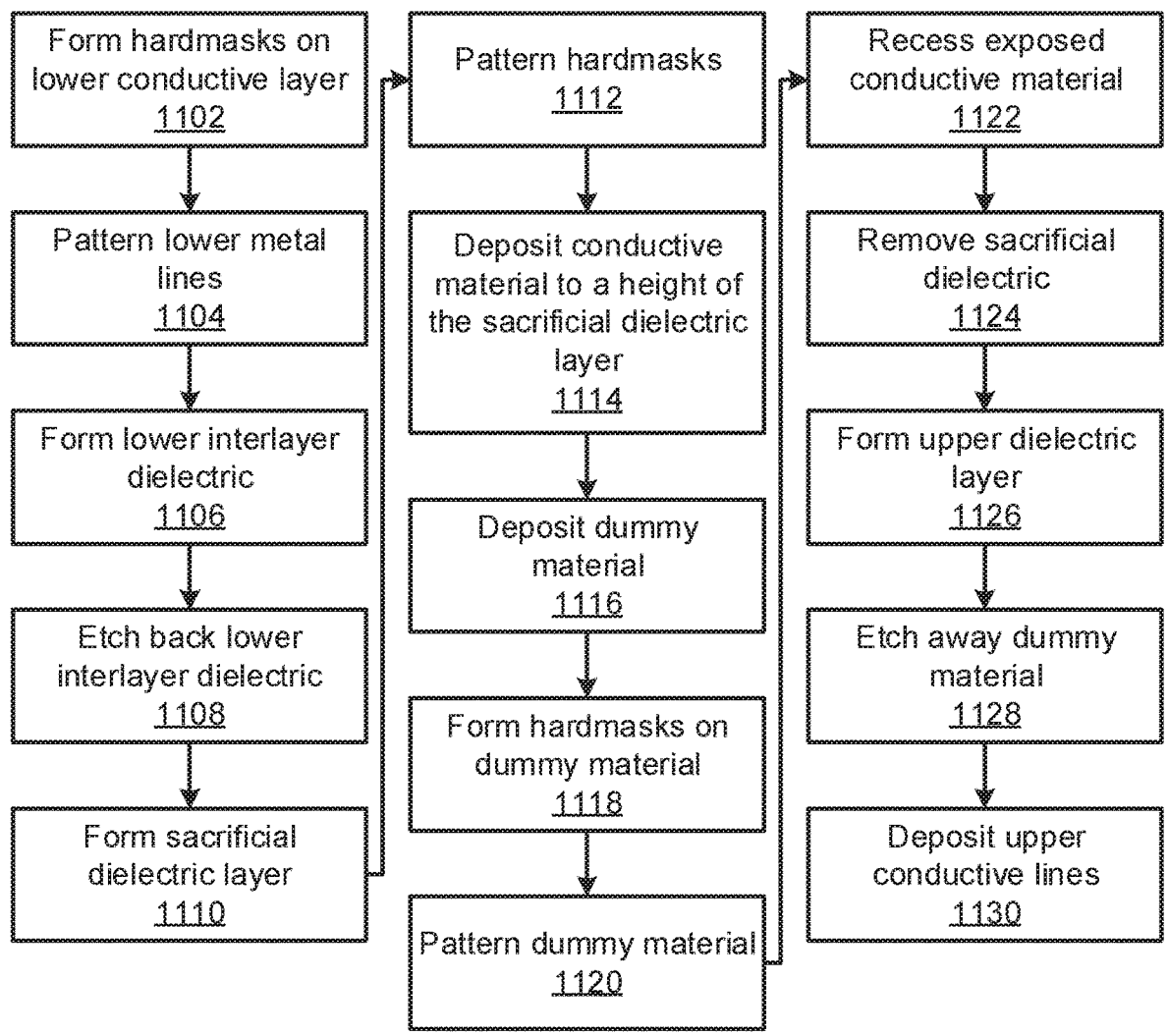
FIG. 11 is a block/flow diagram of a method of fabricating an integrated chip with fully aligned top vias by forming dummy lines in accordance with an embodiment of the present invention.

Referring now to FIG. 11, a method of forming a chip having multiple layers with conductive lines and fully aligned vias is shown. Block 1102 forms hardmasks 108/110 on a layer of conductive material. The hardmasks 108/110 can be formed from alternating, selectively etchable hardmask materials and can be formed by any appropriate process such as, e.g., photolithography or sidewall image transfer. Block 1104 then patterns the conductive material to form lower conductive lines 104. Block 1106 then forms a lower interlayer dielectric 106 around the lower conductive lines 104 to a height of the hardmasks 108/110. The lower interlayer dielectric 106 can be formed by any appropriate deposition process, followed by a CMP process that stops on one or both of the hardmasks 108/110. As noted above, it is specifically contemplated that the lower interlayer dielectric 106 can be formed from a low-k dielectric material.

Block 1108 etches back the lower interlayer dielectric 106 to expose the hardmasks 108/110 and a small portion of the conductive lines 104. Block 1108 can include, for example, a timed isotropic or anisotropic etch that exposes about 5 nm to about 10 nm of the lower conductive lines 104. Block 1110 then deposits a sacrificial dielectric layer 202 back up to the height of the hardmasks 108/110 using any appropriate deposition process, followed by a CMP process down to the height of the hardmasks 108/110.

Block 1112 patterns the hardmasks 108/110 to expose the underlying conductive lines 104 using an anisotropic etch. Block 1114 deposits additional conductive material to a height of the sacrificial dielectric layer 202 to a height of the sacrificial layer 202. Block 1116 then deposits dummy material layer 502 over the sacrificial layer 202 using any appropriate deposition process, to a height of eventual upper conductive lines.

Block 1118 forms hardmasks 504/506 on the dummy material layer 502 using any appropriate process including, e.g., photolithography or sidewall image transfer. Block 1120 patterns the dummy material layer 502 to form dummy lines 602 using a selective anisotropic etch such as, e.g., RIE. Block 1122 recesses the exposed conductive material around the dummy lines 602 using a timed, selective anisotropic etch. Block 1124 etches away the sacrificial dielectric layer 202 and the hardmasks 504/506 using one or more selective etches, including an isotropic etch that removes the sacrificial layer 202 from underneath the dummy lines 602.

Block 1126 forms an upper dielectric layer 902 around the dummy lines 602 by depositing dielectric material using a conformal or spin-on deposition process and then polishing down to the dummy lines 602 using a CMP process. It is specifically contemplated that the upper dielectric layer 902 can be formed from a low-k dielectric material. Block 1128 then etches away the dummy lines 602 using any appropriate etch process to expose the underlying vias 802. Block 1130 deposits upper conductive lines 1002 where the dummy lines 602 used to be, making electrical contact with the underlying vias 802.

It should be understood that the present embodiments represent just one part of the fabrication of an integrated chip or semiconductor device. While the present embodiments focus on the fabrication of conductive lines through layers and vertical vias that connect them, it should be understood that practical embodiments may also include many devices that are connected to the conductive lines and that communicate with one another thereby.

Having described preferred embodiments of fully aligned top vias with replacement metal lines (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating an integrated chip, comprising:
  forming lower conductive lines on an underlying layer, including:
    patterning a layer of conductive material using alternating hardmasks to form initial lines; and
    forming a lower interlayer dielectric layer having top surface that has a height lower than a height of a top surface of the initial lines, after patterning the layer of conductive material;
  forming upper dummy lines over the lower conductive lines;
  recessing the lower conductive lines to form conductive vias between the lower conductive lines and the upper dummy lines; and
  replacing the upper dummy lines with upper conductive lines that contact the conductive vias.

2. The method of claim 1, further comprising forming a dielectric stack around the lower conductive lines before forming the upper dummy lines, wherein the dielectric stack includes a lower interlayer dielectric layer and a sacrificial dielectric layer on top of the lower interlayer dielectric layer.

3. The method of claim 2, wherein recessing the lower conductive lines comprises recessing the lower conductive lines to a depth below a bottom surface of the sacrificial dielectric layer.

4. The method of claim 1, wherein forming the lower conductive lines further includes
forming a sacrificial layer on the lower interlayer dielectric layer having a top surface that has a height equal to the height of the top surface of the initial lines.

5. The method of claim 4, wherein forming the lower conductive lines further comprises:
patterning the alternating hardmasks to expose portions of the initial lines; and
depositing additional conductive material on the exposed portions of the initial lines to a height equal to a top surface of the sacrificial layer.

6. The method of claim 1, further comprising forming an upper interlayer dielectric layer around the upper dummy lines before replacing the upper dummy lines.

7. The method of claim 6, further comprising completely etching away a sacrificial dielectric layer before forming the upper dielectric layer.

8. The method of claim 6, wherein the upper interlayer dielectric is formed from a low-k dielectric material that is not exposed to a metal-patterning etch.

9. The method of claim 1, wherein forming the upper dummy lines comprises:
forming a layer of dummy material over the lower conductive lines; and
patterning the layer of dummy material to form lines formed from the dummy material, with at least one upper dummy line being positioned in direct contact with a lower conductive line.

10. The method of claim 1, wherein the upper dummy lines are formed from a material selected from the group consisting of titanium nitride and amorphous silicon.

11. The method of claim 1, wherein forming the upper dummy lines is performed before recessing the lower conductive lines.

12. The method of claim 5, wherein depositing additional conductive material on the exposed portions of the initial lines includes depositing the additional conductive material directly on the initial lines.

13. A method for fabricating an integrated chip, comprising:
forming lower conductive lines on an underlying layer, including patterning a layer of conductive material using alternating hardmasks to form initial lines, wherein the lower interlayer dielectric layer is formed to a height lower than a height of a top surface of the initial lines;
forming a dielectric stack around the lower conductive lines after forming the lower conductive lines, including a lower interlayer dielectric layer and a sacrificial dielectric layer on top of the lower interlayer dielectric layer;
forming upper dummy lines over lower conductive lines;
recessing the lower conductive lines below a bottom surface of the sacrificial dielectric layer to form conductive vias between the lower conductive lines and the upper dummy lines;
etching away the sacrificial dielectric layer;
forming an upper interlayer dielectric layer around the upper dummy lines; and
replacing the upper dummy lines with upper conductive lines that contact the conductive vias.

14. The method of claim 13, wherein forming the lower conductive lines further includes
forming a sacrificial layer on the lower interlayer dielectric layer having a top surface that has a height equal to the height of the top surface of the initial lines.

15. The method of claim 14, wherein forming the lower conductive lines further comprises:
patterning the alternating hardmasks to expose portions of the initial lines; and
depositing additional conductive material on the exposed portions of the initial lines to a height equal to a top surface of the sacrificial layer.

16. The method of claim 14, wherein forming the upper dummy lines comprises:
forming a layer of dummy material over the lower conductive lines; and
patterning the layer of dummy material to form lines formed from the dummy material, with at least one upper dummy line being positioned in direct contact with a lower conductive line.

17. The method of claim 13, wherein the upper interlayer dielectric and the lower interlayer dielectric are both formed from a low-k dielectric material that are not exposed to a metal-patterning etch.

18. The method of claim 13, wherein the upper dummy lines are formed from a material selected from the group consisting of titanium nitride and amorphous silicon.

19. The method of claim 13, wherein etching away the sacrificial dielectric layer completely removes the sacrificial dielectric layer.

* * * * *